United States Patent
Shanton

(10) Patent No.: US 7,375,633 B2
(45) Date of Patent: May 20, 2008

(54) METHODS AND SYSTEMS FOR IN-LINE RFID TRANSPONDER TESTING

(75) Inventor: Kenneth Shanton, West Chicago, IL (US)

(73) Assignee: Smurfit-Stone Container Enterprises, Inc., Chicago, IL (US)

( * ) Notice: Subject to any disclaimer, the term of this patent is extended or adjusted under 35 U.S.C. 154(b) by 302 days.

(21) Appl. No.: 11/184,096

(22) Filed: Jul. 19, 2005

(65) Prior Publication Data

US 2007/0018831 A1    Jan. 25, 2007

(51) Int. Cl.
*G08B 13/14* (2006.01)

(52) U.S. Cl. ............................ 340/572.1; 340/572.4; 340/572.7; 340/572.8; 235/439; 235/492; 324/667; 324/775; 324/765

(58) Field of Classification Search .............. 340/572.7, 340/572.8, 572.1, 572.4; 235/437, 492; 324/667, 324/775, 765
See application file for complete search history.

(56) References Cited

U.S. PATENT DOCUMENTS

| | | | |
|---|---|---|---|
| 5,983,363 A | 11/1999 | Tuttle et al. | |
| 6,236,223 B1 | 5/2001 | Brady et al. | |
| 6,487,681 B1 | 11/2002 | Tuttle et al. | |
| 2004/0160233 A1 | 8/2004 | Forster | |
| 2005/0223286 A1* | 10/2005 | Forster | 714/25 |
| 2006/0255941 A1* | 11/2006 | Carrender et al. | 340/572.1 |

* cited by examiner

*Primary Examiner*—Tai Nguyen
(74) *Attorney, Agent, or Firm*—Armstrong Teasdale LLP

(57) ABSTRACT

Methods and apparatus for testing the health of each of a plurality of RFID transponders is provided. The apparatus includes an antenna support assembly including an antenna support body and an antenna coupled to a surface of the antenna support body, the antenna including at least a receiver portion and a connection portion. The apparatus also includes a holder coupled to the antenna support body configured to retain the antenna support proximate a path of a plurality of transponders.

31 Claims, 4 Drawing Sheets

METHODS AND SYSTEMS FOR IN-LINE RFID TRANSPONDER TESTING

BACKGROUND OF THE INVENTION

This invention relates generally to wireless communication systems and, more particularly, to manufacturing radio frequency identification (RFID) components.

At least some known RFID systems include a transponder, an antenna, and a transceiver with a decoder, or a reader. The transponder typically includes a radio frequency integrated circuit, and an antenna positioned on a substrate, such as an inlet or tag. The antenna receives RF energy from the reader wirelessly and transmits the data encoded in the received RF energy to the radio frequency integrated circuit.

RF transponder "readers" utilize an antenna as well as a transceiver and decoder. When a transponder passes through an electromagnetic zone of a reader, the transponder is activated by the signal from the antenna. The reader decodes the data on the transponder and this decoded information is forwarded to a host computer for processing. Readers or interrogators can be fixed, mobile or handheld devices, depending on the particular application.

Several different types of transponders are utilized in RFID systems, including passive, semi-passive, and active transponders. Each type of transponder may be read only or read/write capable. Passive transponders obtain operating power from the radio frequency signal of the reader that interrogates the transponder. Semi-passive and active transponders are powered by a battery, which generally results in a greater read range. At least some known semi-passive transponders operate on a timer and periodically transmit information to the reader. Transponders are also activated when they are read or interrogated by a reader. Active transponders are capable of initiating communication with a reader, whereas passive and semi-passive transponders are activated only when they are read by another device first. When multiple transponders are located in a radio frequency field, each transponder may be read individually or multiple transponders may be read substantially simultaneously. Additionally, in various embodiments, one or more environmental sensors are coupled to the transponders to sense environmental conditions, such as temperature, pressure, humidity, vibration, and shock. The status of the environmental condition is then communicated to the reader.

RFID transponders for articles in a global supply chain are mass produced in rolls of many hundreds or thousands of tags. Verifying the proper operation of such a large quantity of tags is laborious and time consuming. Verification of operation after the tag is fully assembled with an antenna, for example, in a completed strap, wastes the material of the strap and antenna and the manufacturing steps required to complete the strap if the transponder is found to be defective during testing of the completed strap. Accordingly, is it not desirable to attach an antenna and complete assembly of the transponder if it is defective. However, testing a large quantity of transponders before the strap is completed is difficult because communicating with the transponder uses the antenna.

BRIEF DESCRIPTION OF THE INVENTION

In one embodiment, an apparatus for testing the health of each of a plurality of RFID transponders includes an antenna support body and an antenna coupled to a surface of the antenna support body, the antenna including at least a receiver portion and a connection portion. The apparatus also includes a holder coupled to the antenna support body configured to retain the antenna support body proximate a path of a plurality of transponders.

In another embodiment, a packaging handling system for at least one of manufacturing and assembling radio frequency identification enabled packaging material includes a supply of packaging material, a supply of RFID straps including a web wherein the RFID straps are adhesively coupled to the web, the RFID straps are configured to be removed from the web and adhesively coupled to the supply of packaging material, a testing apparatus including, an antenna support assembly including an antenna coupled to a surface of the antenna support assembly, the antenna including at least a receiver portion and a connection portion and a holder coupled to the antenna support assembly configured to retain the antenna support assembly in a substantially fixed position proximate a web path of a plurality of transponders coupled to a web.

In yet another embodiment, a method of testing an RFID enabled component proximate a plurality of RFID enabled components includes providing a plurality of RFID enabled components, temporarily coupling an antenna to at least one of the plurality of RFID enabled components, and determining the health of the at least one of the plurality of RFID enabled components using the temporary antenna.

DETAILED DESCRIPTION OF THE INVENTION

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

Figure 1:
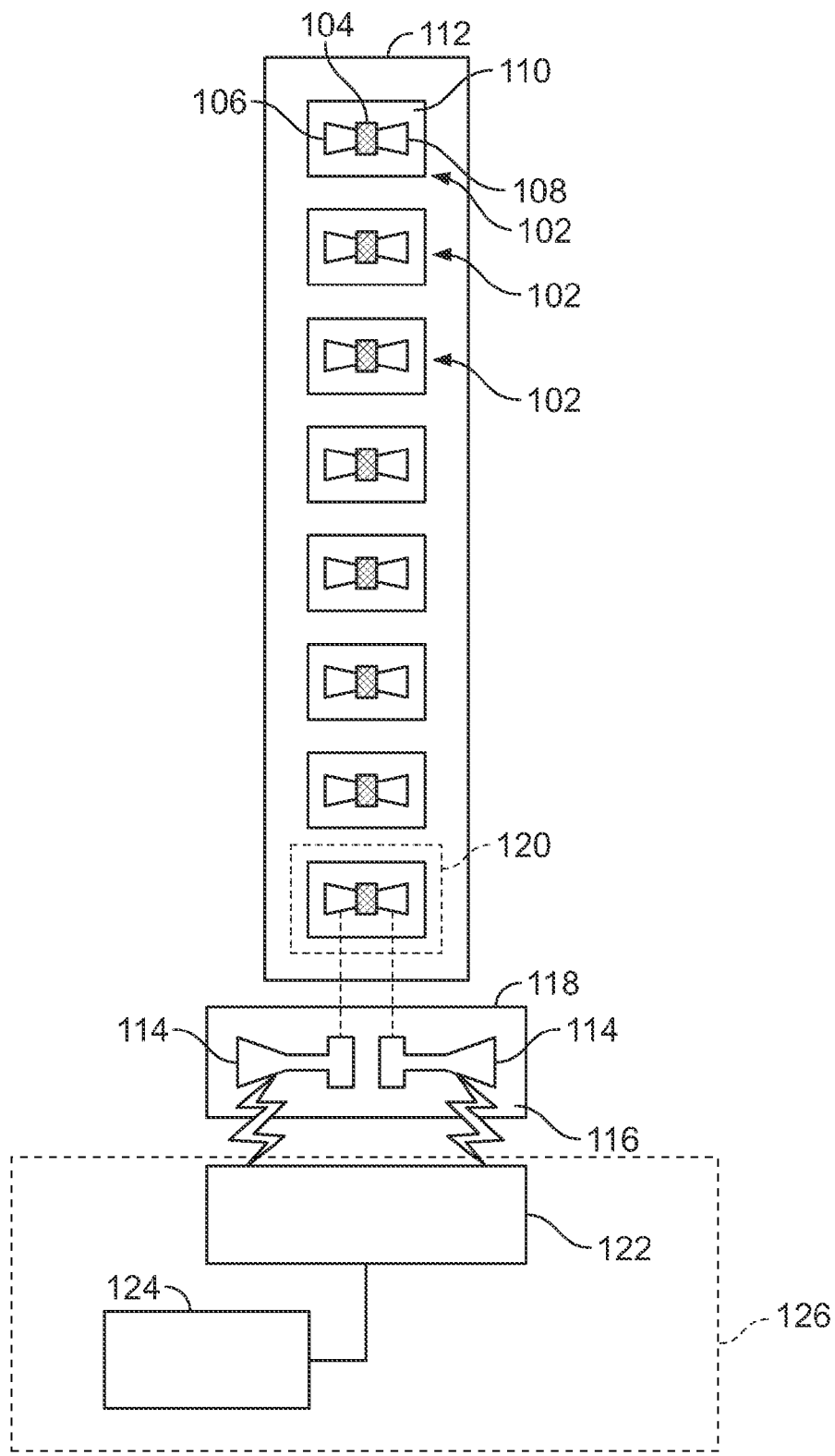
FIG. 1 is a schematic diagram of an exemplary testing system for an RFID-enabled component.

FIG. 1 is a schematic diagram of an exemplary testing system 100 for an RFID-enabled component, such as a strap 102. In the exemplary embodiment, strap 102 includes an electronic circuit chip 104 and a contact pad 106 and 108 coupled to contact bumps (not shown) extending from a surface (not shown) of chip 104. Strap 102 is adhesively coupled to a strap substrate 110. In one embodiment of the invention, strap 102 includes a heat activated anisotropic conductive adhesive coupled to at least one surface of strap 102. A web 112 of flexible material supports straps 102. Typically, web 112 is rolled onto a spool such that a plurality of straps 102 is supplied in a roll that is couplable to a dispensing machine using the spool. An antenna 114 is coupled to an antenna support assembly 116. Antenna 114 is printed onto a surface 118 antenna support assembly 116 using a conductive ink, for example, an ink containing at least one of copper, aluminum, silver, and organic conducting polymers. Alternatively, a conductive foil antenna, for example, an antenna containing at least one of aluminum, silver and copper foil is coupled to antenna support assembly 116 using, for example, an adhesive. Antenna 114 on antenna support assembly 116 is pressed into substantial contact with contact pads 106 and 108 such that electrical contact is made between contact pads 106 and 108 and antenna 114. Alternatively, antenna 114 on antenna support assembly 116 is pressed proximate to contact pads 106 and 108 such that contact pads 106 and 108 and antenna 114 are capacitively coupled. To facilitate contact or proximity of contact pads 106 and 108 and antenna 114, a roller 120 is used to apply a force against web 112 of hold contact pads 106 and 108 and antenna 114 in contact or relatively close proximity. A reader antenna 122 is positioned proximate antenna 114 and antenna 122 is coupled to a transmit/receive unit 124 of an REID reader 126.

During operation, web 112 carries straps 102 proximate antenna 114. In one embodiment, web 112 slides across surface 118 such that contact pads 106 and 108 of each strap 102 sequentially pass proximate antenna 114. In another embodiment, slidable engagement between web 112 and antenna 114 is facilitated using roller 120. In still another embodiment, a pad is used to intermittent push web 112 against antenna 114 when strap 102 is positioned proximate antenna 114. While contact pads 106 and 108 and antenna 114 are communicatively coupled by their close proximity and/or electrical contact, transmit/receive unit 124 generates RF signals which, are transmitted to electronic circuit chip 104 through reader antenna 122 and antenna 114. If transmit/receive unit 124 receives a predetermined response from chip 104 the associated strap 102 is determined to be functional. If transmit/receive unit 124 does not receive a response from chip 104, the strap is determined to be non-functional and is marked or otherwise indicated that strap 102 is non-functional and a next strap 102 is indexed into position proximate antenna 114 and the test repeated. Because of the relatively short amount of time required to perform the test, web 112 may be moving continuously at a relatively high rate of speed during the test. Alternatively, to facilitate an optimal read range, the accurate placement of strap 102 directly over the antenna contact pads is facilitated using a mechanical or optical indexing system 200. For chips 104 that operate in the UHF range, reader antenna 122 is positioned relatively close to strap 102 and antenna 114 for a near-field reading and relatively further away for a far-field reading. By temporarily coupling antenna 114 to a single strap 102 or a predetermined number of straps 102, the straps are effectively singulated such that it is not necessary to provide additional shielding of the other straps. A thin coating may be applied to the antenna to facilitate minimizing wear.

Figure 2:
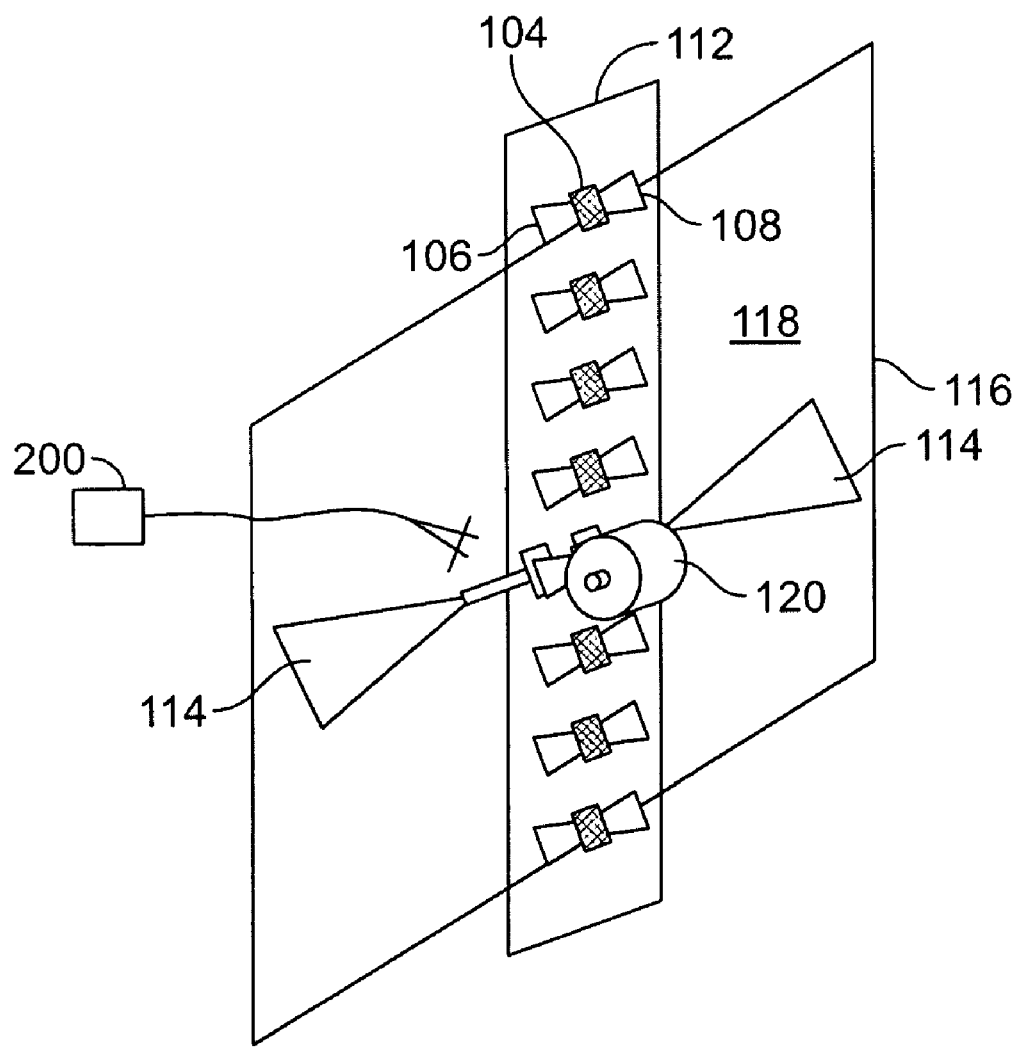
FIG. 2 is a schematic diagram of the web of straps proximate the antenna shown in FIG. 1.

FIG. 2 is a schematic diagram of the web 112 of straps 102 proximate antenna 114. In the exemplary embodiment, roller 120 applies a force to web 112 that facilitates holding contact pads 106 and 108 and antenna 114 in contact with respect to each other or in close proximity with respect to each other. In the exemplary embodiment, roller 120 is illustrated as a cylindrical body configured to roll while applying a force of web 112. In an alternative embodiment, roller 120 is a pad that slidably engages web 112 to apply a force to retain web 112 proximate antenna 114.

Figure 3:
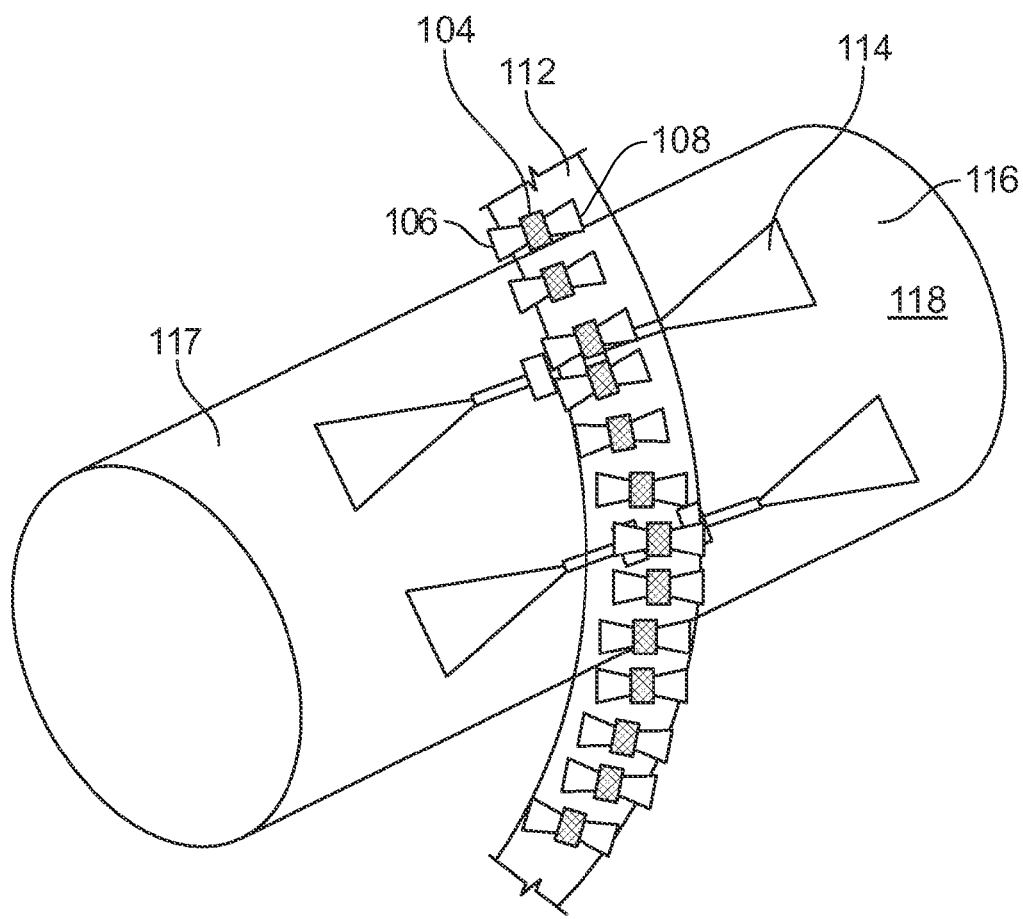
FIG. 3 is a schematic diagram of an exemplary antenna support assembly that includes a convexly curved surface.
Figure 4:
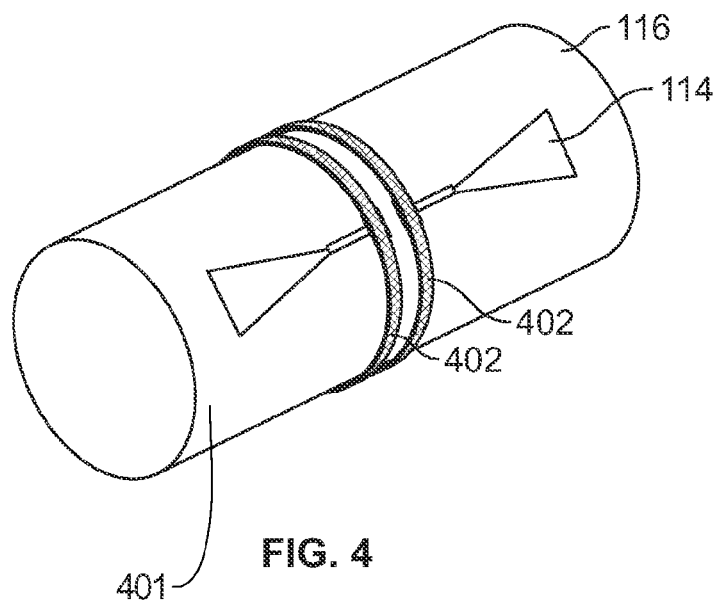
FIG. 4 is a schematic diagram of an exemplary antenna support assembly that includes contact pads that extend circumferentially about a substantially cylindrical surface of the antenna support assembly.
Figure 5:
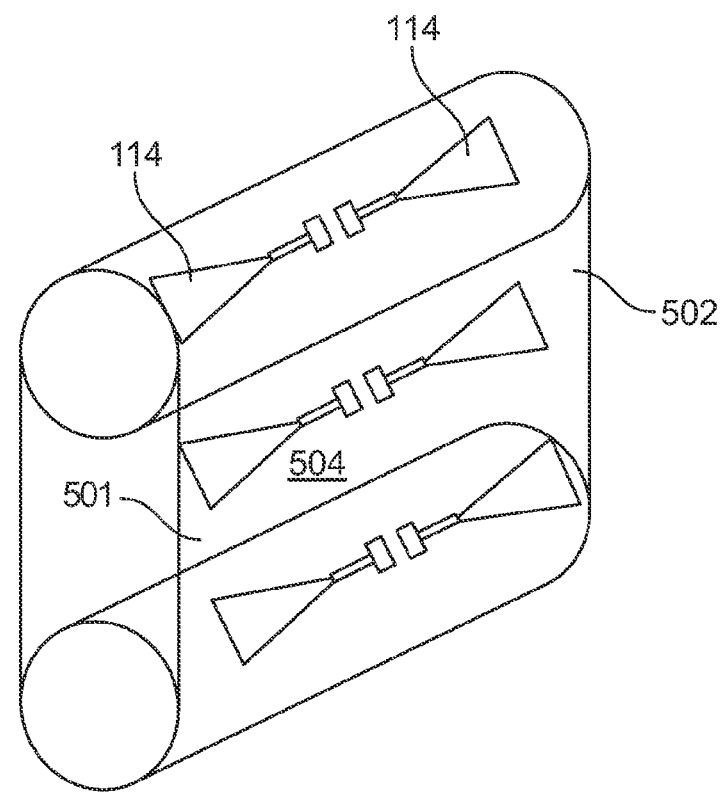
FIG. 5 is a schematic diagram of another exemplary antenna support assembly 116 that includes a continuous belt having a plurality of antennas spaced about a radially outer surface.

FIG. 3 is a schematic diagram of an exemplary antenna support assembly 116 that includes a holder 117 having a convexly curved surface 118. FIG. 4 is a schematic diagram of an exemplary antenna support assembly 116 that includes a holder 401 having contact pads 402 that extend circumferentially about a substantially cylindrical surface 406 of antenna support assembly 116. FIG. 5 is a schematic diagram of another exemplary antenna support assembly 116 that includes a holder 501 comprising a continuous belt 502 having a plurality of antennas 114 spaced about a radially outer surface 504.

Although the embodiments described herein are discussed with respect to supply chain packaging material, it is understood that the RF-enabled component assembly and processing methodology described herein is not limited to supply chain packaging applications, but may be utilized in other non-packaging applications.

The above-described embodiments of an in-line RFID transponder testing system provide a cost-effective and reliable means for testing of RF identification enabled transponders at a speed compatible with mass production of RFID-enabled products. The system provides a method of determining the health of a chip on a strap pre-sorting and/or marking defective straps such they may be discarded before being assembled into packaging material, tags, labels, or other RFID enabled product and so that a credit can be obtained from the supplier. The testing is non-contact in one embodiment or carried out at low contact pressure in another embodiment. As a result, the described methods and systems facilitate in-line RFID transponder testing in a cost-effective and reliable manner.

Exemplary embodiments of in-line RFID transponder assembly methods and apparatus are described above in detail. The in-line RFID transponder assembly components illustrated are not limited to the specific embodiments described herein, but rather, components of each imaging system may be utilized independently and separately from other components described herein. For example, the in-line RFID transponder assembly components described above may also be used in combination with different in-line RFID transponder assembly components. A technical effect of the various embodiments of the systems and methods described herein include facilitating assembly of RF enabled packaging materials at production level speeds.

While the invention has been described in terms of various specific embodiments, those skilled in the art will recognize that the invention can be practiced with modification within the spirit and scope of the claims.

What is claimed is:

1. An apparatus for testing the health of each of a plurality of RFID transponders, said apparatus comprising:
   an antenna support assembly comprising an antenna support body and an antenna coupled to a surface of the antenna support body, said antenna comprising at least a receiver portion and a connection portion;
   a holder coupled to said antenna support body configured to retain said antenna support body in a selectable position proximate a path of a plurality of RFID transponders coupled to a web; and
   an RFID reader comprising:
      a reader antenna configured to transmit and receive RF energy;
      a transmit/receive unit communicatively coupled to said reader antenna, said transmit/receive unit configured to transmit a test signal to a transponder being tested, said transmit/receive unit configured to receive a response to the test signal from the transponder being tested.

2. An apparatus in accordance with claim 1 wherein said antenna comprises at least one of a conductive ink and a metallic foil.

3. An apparatus in accordance with claim 1 wherein said surface of said antenna support body is substantially planar.

4. An apparatus in accordance with claim 1 wherein said surface of said antenna support body is substantially convex.

5. An apparatus in accordance with claim 1 wherein said antenna support assembly comprises a substantially cylindrical body, said surface of said antenna support body comprising at least one antenna oriented parallel with a longitudinal axis of the antenna support body.

6. An apparatus in accordance with claim 1 wherein said antenna support assembly comprises a substantially cylindrical body, said surface of said antenna support body comprising a plurality of antennae oriented parallel with a longitudinal axis of the antenna support body and spaced circumferentially a distance about said surface of said antenna support body.

7. An apparatus in accordance with claim 1 wherein said antenna support assembly comprises a web comprising a plurality of antennae oriented parallel with a longitudinal axis of the antenna support and spaced circumferentially a distance about the web surface.

8. An apparatus in accordance with claim 1 further comprising a pressure applicator spaced a gap distance apart from said antenna support body and oriented orthogonally with respect to said connection portion.

9. An apparatus in accordance with claim 8 wherein said pressure applicator comprises a substantially cylindrical roller configured to rotate about a longitudinal axis of the roller and apply a pressure force in a direction towards said antenna support.

10. An apparatus in accordance with claim 8 wherein said pressure applicator comprises a substantially planar pad configured to apply a pressure force in a direction towards said antenna support.

11. An apparatus in accordance with claim 1 wherein said connection portion is configured to couple to a connection member of a transponder being tested.

12. An apparatus in accordance with claim 11 wherein said connection portion is configured to couple capacitively to a connection member of a transponder being tested.

13. An apparatus in accordance with claim 1 wherein said transmit/receive unit is configured to receive an index signal indicative of said antenna being coupled to the transponder being tested, said transmit/receive unit is configured to transmit a signal indicative of the health of the transponder being tested.

14. A packaging handling system for at least one of manufacturing and assembling radio frequency identification enabled packaging material comprising:
 a supply of packaging material;
 a supply of RFID straps adhesively coupled to a web, said RFID straps configured to be removed from said web and adhesively coupled to said supply of packaging material; and
 a testing apparatus comprising:
  an antenna support assembly comprising an antenna support body and an antenna coupled to a surface of the antenna support body, said antenna comprising at least a receiver portion and a connection portion;
  a holder coupled to said antenna support body configured to retain said antenna support body in a selectable position proximate a path of a plurality of RFID transponders coupled to a web; and
  an RFID reader comprising:
   a reader antenna configured to transmit and receive RF energy; and
   a transmit/receive unit communicatively coupled to said reader antenna, said transmit/receive unit configured to transmit a test signal to a transponder being tested, said transmit/receive unit configured to receive a response to the test signal from the transponder being tested.

15. A system in accordance with claim 14 wherein said antenna comprises at least one of a conductive ink and a metallic foil.

16. A system in accordance with claim 14 wherein said surface of said antenna support body is substantially planar.

17. A system in accordance with claim 14 wherein said surface of said antenna support body is substantially convex.

18. A system in accordance with claim 14 wherein said antenna support assembly comprises a substantially cylindrical body, said surface of said antenna support body comprising at least one antenna oriented parallel with a longitudinal axis of the antenna support.

19. A system in accordance with claim 14 wherein said antenna support assembly comprises a substantially cylindrical body, said surface of said antenna support body comprising a plurality of antennae oriented parallel with a longitudinal axis of the antenna support body and spaced circumferentially a distance about said surface of said antenna support body.

20. A system in accordance with claim 14 wherein said antenna support assembly comprises a web comprising a plurality of antennae oriented parallel with a longitudinal axis of the antenna support assembly and spaced circumferentially a distance about the web surface.

21. A system in accordance with claim 14 further comprising a pressure applicator spaced a gap distance apart from said antenna support body and oriented orthogonally with respect to said connection portion.

22. A system in accordance with claim 21 wherein said pressure applicator comprises a substantially cylindrical roller configured to rotate about a longitudinal axis of the roller and apply a pressure force in a direction towards said antenna support body.

23. A system in accordance with claim 21 wherein said pressure applicator comprises a substantially planar pad configured to apply a pressure force in a direction towards said antenna support body.

24. A system in accordance with claim 14 wherein said connection portion is configured to couple to a connection member of a transponder being tested.

25. A system in accordance with claim 24 wherein said connection portion is configured to couple capacitively to a connection member of a transponder being tested.

26. A system in accordance with claim 14 wherein said transmit/receive unit is configured to receive an index signal indicative of said antenna being coupled to the transponder being tested, said transmit/receive unit is configured to transmit a signal indicative of the health of the transponder being tested.

27. A method of testing an RFID enabled component, said method comprising:
 providing a plurality of RFID enabled components;
 temporarily coupling an antenna in electrical contact to at least one of the plurality of RFID enabled components while the plurality of RFID enabled components are moving continuously past the antenna during the testing; and determining a health of the at least one of the plurality of RFID enabled components using the temporarily coupled antenna.

28. A method in accordance with claim 27 further comprising indicating which of the plurality of RFID enabled components are non-functional using the determined health wherein non-functional represents that the RFID-enabled component at least one of does not respond to a test signal and responds incorrectly to the test signal relative to a predetermined expected response.

29. A method in accordance with claim 27 wherein determining the health of the RFID enabled component comprises transmitting an RF signal to the component through the temporary antenna.

30. A method in accordance with claim 27 wherein determining the health of the RFID enabled component comprises receiving an RF signal from the component through the temporary antenna that indicates a health of the component.

31. A method in accordance with claim 27 wherein providing a plurality of RFID enabled components comprises providing a plurality of straps adhesively coupled to a web.

* * * * *